(12) United States Patent
Capalija et al.

(10) Patent No.: US 12,118,060 B2
(45) Date of Patent: Oct. 15, 2024

(54) COMPUTATIONAL CIRCUIT WITH HIERARCHICAL ACCUMULATOR

(71) Applicant: Tenstorrent Inc., Toronto (CA)

(72) Inventors: Davor Capalija, Toronto (CA); Ljubisa Bajic, Toronto (CA); Alex Cejkov, Toronto (CA)

(73) Assignee: Tenstorrent Inc., Toronto (CA)

( * ) Notice: Subject to any disclaimer, the term of this patent is extended or adjusted under 35 U.S.C. 154(b) by 484 days.

(21) Appl. No.: 17/545,860

(22) Filed: Dec. 8, 2021

(65) Prior Publication Data
US 2023/0177106 A1    Jun. 8, 2023

(51) Int. Cl.
*G06F 17/16* (2006.01)
*G11C 11/419* (2006.01)

(52) U.S. Cl.
CPC ............ *G06F 17/16* (2013.01); *G11C 11/419* (2013.01)

(58) Field of Classification Search
CPC ........ G06F 17/16; G06F 17/15; G06F 7/5443; G06F 7/509; G11C 11/419
USPC .................................................. 708/130, 490
See application file for complete search history.

(56) References Cited

U.S. PATENT DOCUMENTS

| | | |
|---|---|---|
| 2004/0193668 A1 | 9/2004 | Devaney et al. |
| 2010/0229176 A1 | 9/2010 | Genden et al. |
| 2015/0242307 A1 | 8/2015 | Busaba et al. |
| 2019/0205358 A1 | 7/2019 | Diril et al. |
| 2020/0026498 A1 | 1/2020 | Sumbul et al. |
| 2021/0173662 A1 | 6/2021 | Leenstra et al. |

FOREIGN PATENT DOCUMENTS

| | | |
|---|---|---|
| CN | 104252331 A | 12/2014 |
| EP | 0992885 A1 | 4/2000 |

OTHER PUBLICATIONS

Communication under Rule 71(3) EPC from EP Application No. 22212296.2, dated Apr. 19, 2024, 38 pages.
Extended European Search Report from EP Application No. 22212296.2 dated Apr. 25, 2023, 5 pages.

*Primary Examiner* — Tan V Mai
(74) *Attorney, Agent, or Firm* — Daylight Law, P.C.

(57) ABSTRACT

Methods and systems relating to computational circuitry are disclosed herein. A disclosed computational circuit includes a math circuit, a first accumulator, and a second accumulator. The first accumulator has a first memory. The second accumulator has a second memory. The first accumulator is communicatively connected to the math circuit and accumulates values from the math circuit in the first memory. The second accumulator is communicatively connected to the first memory and accumulates values from the first memory in the second memory. The first memory is faster and smaller than the second memory.

19 Claims, 5 Drawing Sheets

COMPUTATIONAL CIRCUIT WITH HIERARCHICAL ACCUMULATOR

BACKGROUND

Computational circuits such as arithmetic logic units (ALUs), floating point logic units (FPUs), and other related combinational digital circuits are fundamental components of a computing system which perform arithmetic and logical operations on data to execute computations. While such combinational digital circuits are discrete on the scale of an entire central processing unit (CPU), each includes a multitude of individual logic circuits to execute various operations on the data that is supplied to the overall digital circuit. Among others, such as basic AND and OR blocks, these individual logic circuits can include more complex circuits such as accumulators, which include memory in which intermediate results for stepwise functions are stored. For example, a payroll program that was designed to calculate the total number of hours worked by a given employee could store a running total of hours in such memory, and iteratively receive and add the hours worked for each day to the value in the memory and replace the value in the memory with the output of the function. As used herein, the term "accumulator" refers to the logic circuitry that conducts the associated iterative read, write, and computation operations in addition to the memory in which the value is stored.

One application in which accumulators are particularly important is for large matrix multiplication or convolution operations. Matrix multiplications for certain applications, such as in the execution of an artificial neural network (ANN), require massive product-sum computations. As the data structures associated with standard ANNs can include millions or even billions of elements, a matrix multiplication conducted on such a data structure can likewise be associated with an immense number of computations. Computational circuits which are dedicated to the execution of large matrix multiplications can include accumulators which are configured to hold the output of a matrix multiplication where the accumulator includes multiple sectors individually associated with respective individual portions of the output of the matrix multiplication. The product-sums for calculating each portion of the output of the matrix multiplication can be calculated by passing the input data to a set of multiplication circuits and accumulating the outputs of those multiplication circuits in a sector of the accumulator. While this can lead to an efficient execution of a complex computation, the size of the accumulator can be cost prohibitive. Math circuits can be designed to conduct computations so fast that only register memory can keep pace with the circuits. However, register memory is relatively expensive compared with relatively slower memory such as static random-access memory or dynamic random-access memory. Also, the output of a large matrix multiplication, or other complex computation, can be an immense matrix. As such, if a sector of an accumulator using register memory needs to be dedicated for each portion of such a large matrix, the accumulator may be prohibitively expensive.

SUMMARY

Methods and systems related to the field of computer processing architectures and circuitry are disclosed. The systems disclosed herein include computational circuits with hierarchical accumulators. The systems disclosed herein include hierarchical accumulators with hierarchies of two or more levels, with each level including an accumulator, and in which each level down the hierarchy includes an accumulator with increased size, decreased cost-per-bit, and decreased speed relative to the accumulator in the level above it in the hierarchy. These disclosed hierarchical accumulators result in fast low-cost accumulators with enhanced performance for complex computations.

In specific embodiments of the invention, at least the first level of a hierarchical accumulator is broken into different sectors with at least one sector remaining idle while another sector is being used to accumulate an output value, and the next level of the accumulator is configured to read from the idle sector while the first level is engaged in accumulating an output value in an active sector of the first level. In specific embodiments, at least the first level consists of two sectors with one sector being idle while the other is active and vice versa. In specific embodiments, each subsequent level of the accumulator can read all the values in an idle sector of the prior level before the idle sector of the prior level becomes active again.

In specific embodiments of the invention, the various levels of the accumulator are configured so that each level accumulates at a speed in data elements per second which is at least as fast as the prior level. In specific embodiments of the invention, the speed of an accumulator is set by the speed of the accumulate operations of that level of the accumulator expressed in writes per second divided by the number of accumulate operations required to compute a data element expressed in writes per data element. The speed of each level at producing final values in memory is therefore the speed of the accumulate operation divided by the number of accumulate operations required to compute a data element. Therefore, even though a higher-level accumulator may have a higher accumulation operation speed, if the ratio of the relative number of accumulate operations required to compute a data element between the higher level and the next level is set equal to the ratio of the relative accumulation operation speeds between that next level and that higher level, the hierarchical accumulator can continue to produce values at the fastest rate the computational circuitry can perform without creating any bottlenecks in the various levels of the hierarchy.

In specific embodiments of the invention, the hierarchical accumulators are used as part of the computational units in a network of computational nodes. In these embodiments, the use of a hierarchical accumulator can relieve pressure on the network by increasing data reuse of local data before additional data is required from the network while at the same time not requiring a massive and expensive fast accumulator. In specific embodiments of the invention, the computational circuits that include the disclosed hierarchical accumulators operate on operands which are retrieved from local memory (i.e., local data on the same substrate as a controller and computational circuit) and remote memory (i.e., remote data that is network accessible to the controller and/or computational circuit). The operands can be routed from memory, and through the network, in the form of blocks of a given size, and the hierarchical accumulator can be configured such that it includes a memory capable of storing a block of that given size. Advantageously, this block size can be large which increases the number of computations that can be conducted with a given block before another block must be delivered through the network. This benefit is more than a linear improvement as both the local data blocks and the remote data blocks are larger resulting in a major increase in the number of operations that can be conducted with a single remote data block.

In specific embodiments of the invention, a computational circuit is provided. The computational circuit includes a math circuit. The computational circuit also includes a first accumulator communicatively connected to the math circuit, having a first memory, and that accumulates values from the math circuit in the first memory. The computational circuit also includes a second accumulator communicatively connected to the first memory, having a second memory, and that accumulates values from the first memory in the second memory. The first memory is faster and smaller than the second memory.

In specific embodiments of the invention, a method is provided. The method includes accumulating, using a first accumulator with a first memory, values from a math circuit in the first memory. The method also includes accumulating, using a second accumulator with a second memory, values from the first memory in the second memory. The first memory is faster and smaller than the second memory.

In specific embodiments of the invention, a computational circuit is provided. The computational circuit includes a matrix multiplier array, a register memory, and a static random-access memory. The computational circuit also includes a first accumulator that accumulates values from the matrix multiplier array in the register memory. The computational circuit also includes a second accumulator that accumulates values from the register memory in the static random-access memory.

DETAILED DESCRIPTION

Methods and systems related to the field of computational circuits in accordance with the summary above are disclosed in detail herein. The methods and systems disclosed in this section are nonlimiting embodiments of the invention, are provided for explanatory purposes only, and should not be used to constrict the full scope of the invention. It is to be understood that the disclosed embodiments may or may not overlap with each other. Thus, part of one embodiment, or specific embodiments thereof, may or may not fall within the ambit of another, or specific embodiments thereof, and vice versa. Different embodiments from different aspects may be combined or practiced separately. Many different combinations and sub-combinations of the representative embodiments shown within the broad framework of this invention, that may be apparent to those skilled in the art but not explicitly shown or described, should not be construed as precluded.

Figure 1:
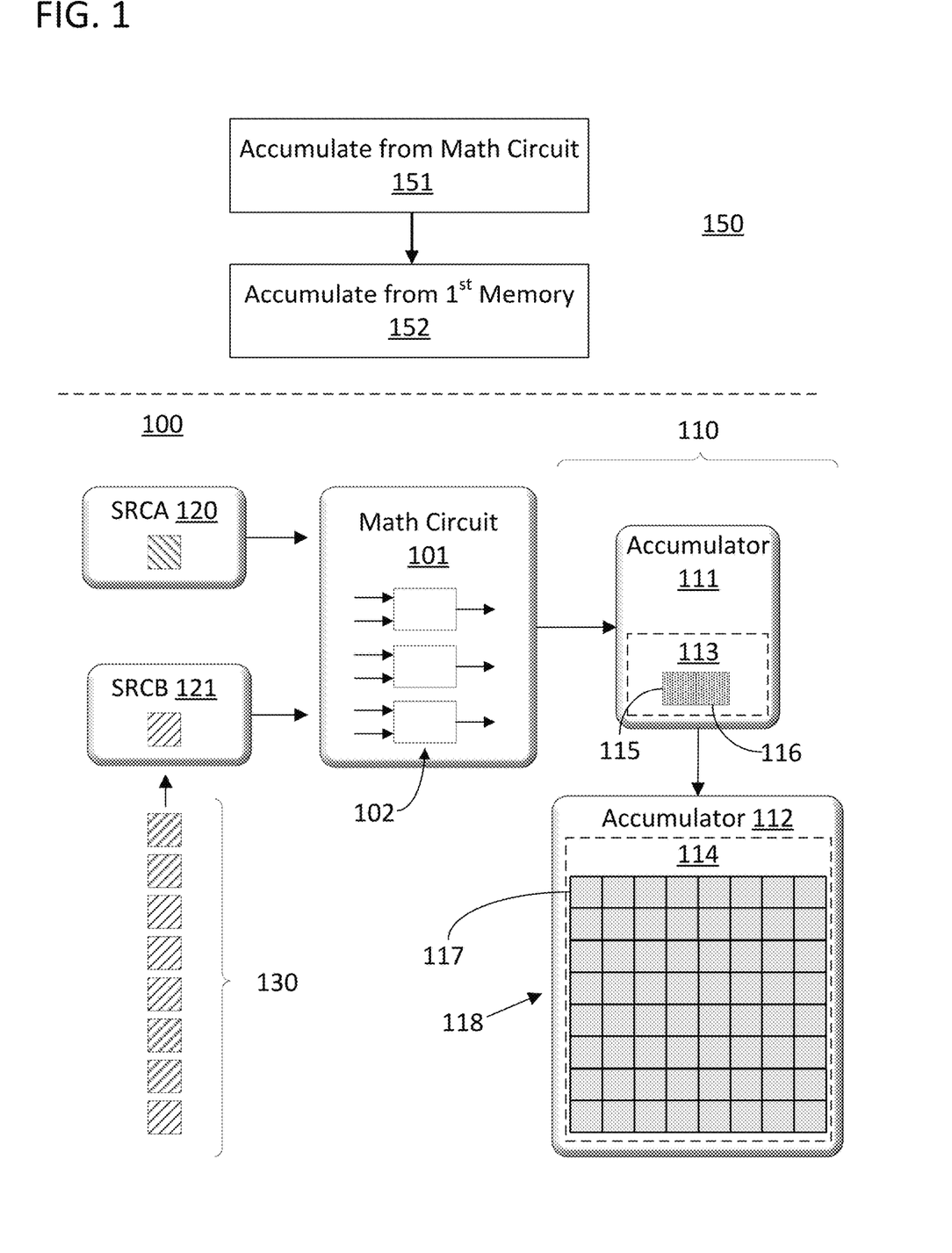
FIG. 1 illustrates a block diagram of a computational circuit with a hierarchical accumulator and a flow chart for a set of methods in accordance with specific embodiments of the invention disclosed herein.

FIG. 1 illustrates a block diagram of a computational circuit 100 with a hierarchical accumulator 110 and a flow chart 150 for a set of methods in accordance with specific embodiments of the invention disclosed herein. Computational circuit 100 includes a math circuit 101 and a hierarchical accumulator 110. The math circuit could be a multiplication array able to take in many operands, multiply them in pairs, and output the product of the pairs. The math circuit could conduct an operation on its input operands and produce outputs in a single clock cycle or produce outputs in series over a set of clock cycles. The outputs could be a set of products required to compute all the elements of an output matrix. Computational circuit 100 also includes two input source registers in the form of source A register 120 and source B register 121. Computational circuit 100 can accumulate the values for a composite computation in a pipeline fashion with multiple pairs of input values being provided to source A register 120 and source B register 121 to conduct multiple component computations of that composite computation using math circuit 101 and accumulating the outputs of those composite computations using hierarchical accumulator 110.

Computational circuit 100 conducts a composite computation on multiple pairs of input values which are provided to source A register 120 and source B register 121. While computational circuit 100 accepts a pair of inputs, alternative computational circuits in accordance with this disclosure can accept many more than two inputs. The inputs can be provided to the input source registers in a pipeline fashion by a control system orchestrating the execution of a composite computation. The values from the source registers are provided to math circuit 101 as the operands for the computations conducted by math circuit 101. The input values stored in source A register 120 and source B register 121 could be scalar data elements of a data type compatible with math circuit 101 (e.g., 8-bit integer, 16-bit floating point, etc.). The input values stored in source A register 120 and source B register 121 could also be vectors or multidimensional tensors with a set of data elements of the same or various data types (e.g., each input could be a 16×16 tensor of individual data elements with each individual data element being a 16-bit floating point data type). Accordingly, the math circuit 101 may include an array of discrete computational circuits 102 to conduct operations on the various data elements of the inputs to the math circuit in parallel. For example, computational circuit 100 could be a matrix multiplication circuit, and math circuit 101 could have an array of discrete multiplication circuits that each take in two values from the input data values (e.g., two 16-bit floating point data element values from two 16×16 tensor input data values) and output the product of those values.

A control system responsible for feeding values to math circuit 101 could be designed to provide new values to source A register 120 and source B register 121 in synchronization with the speed of math circuit 101 to conduct a composite computation such as a large matrix multiplication while keeping math circuit 101 at full capacity. The math circuit 101 could conduct all the component computations required to be conducted on a set of inputs in a single clock cycle. For example, if math circuit 101 included 256 discrete multiplication circuits, each computing in a single clock cycle, math circuit 101 could conduct all the component multiplications needed for a composite computation in the form of a matrix multiplication of two 16×16 tensors in a single clock cycle. However, if the math circuit had not quite so many discrete multiplication circuits, or the discrete multiplication circuits did not compute at a speed of one clock cycle, more than one clock cycle would be required to conduct all the component multiplications.

Hierarchical accumulator 110 accumulates the output values from math circuit 101. Hierarchical accumulator 110 includes a first accumulator 111 and a second accumulator 112. The hierarchical accumulator 110 includes two levels which each consist of accumulators having memory for storing accumulated values, and logic circuits for: reading input values, adding the input values to accumulated values stored in memory, and storing the output of the addition in the memory. The logic circuits can comprise various logic gates, latches, flip-flops, and other digital logic or analog logic components. While hierarchical accumulator 110 includes two levels for ease of explanation, hierarchical accumulators in accordance with this disclosure can have more than two levels.

First accumulator 111 is communicatively connected to math circuit 101, has a first memory 113, and accumulates values from math circuit 101 in first memory 113. The first accumulator 111 can accordingly read a value from memory 113, obtain a value from math circuit 101, conduct an addition operation on both values, and write the result of that addition operation back to memory 113. This operation is shown as step 151 in flow chart 150 and includes accumulating, using a first accumulator 111 with a first memory 113, values from a math circuit 101 in the first memory 113. The speed at which those operations can be conducted can be referred to as the accumulation operation speed of accumulator 111 and can be expressed in units of data element writes per second. First memory 113 can include a first memory sector 115 and a second memory sector 116. The memory sectors can each include many addresses at which data elements can be stored. The data elements can be various data types. However, the data type will generally match the format of the outputs from math circuit 101. For example, first accumulator 111 may retrieve a value from memory sector 115, obtain a value from math circuit 101, conduct a summing operation on both values, and write the sum back into memory sector 115. First memory 113 can be register memory, but it can also be any kind of memory including static random-access memory, dynamic random-access memory, cross bar memory, phase change memory, or any kind of readable and rewritable memory.

Second accumulator 112 is communicatively connected to first memory 113, has a second memory 114, and accumulates values from first memory 113 in second memory 114. The second accumulator 112 can accordingly read a value from memory 114, obtain a value from memory 113, conduct an addition operation on both values, and write the result of that addition operation back to memory 114. This operation is shown as step 152 in flow chart 150 and includes accumulating, using a second accumulator 112 with a second memory 114, values from first memory 113 in second memory 114. The speed at which those operations can be conducted can be referred to as the accumulation operation speed of accumulator 112 and can be expressed in units of data element writes per second. Second memory 114 can include a first memory sector 117 and a set of additional memory sectors 118. The memory sectors can each include many addresses at which data elements can be stored. The data elements can be various data types. However, the data type will generally match the format of the data elements in memory 113. Second memory 114 can be a static random-access memory. However, it can also be register memory, dynamic random-access memory, cross bar memory, phase change memory, or any kind of readable and rewritable memory.

In specific embodiments of the invention, each level of the hierarchical accumulator is slower but has more storage than the prior level of the hierarchy. For example, if computational circuit 100 were a matrix multiplier and math circuit 101 were a multiplier array, memory 113 could be as large as the output matrix generated by all of the products generated by math circuit 101 in response to a pair of operand inputs, and memory 114 could be as large as an output matrix generated from a set of operand inputs, such as set 130, provided to the source registers. Furthermore, each level of the hierarchical accumulator could have a slower accumulation operation speed in data element writes per second than the prior level as attributable to either fewer logic circuits, slower logic circuits, slower memory, or a combination thereof. For example, the math circuit 101 could output values at an output speed of 256 data elements per nanosecond and the first accumulator 111 could accumulate a value from the math circuit 101 in the first memory 113 at a first accumulation operation speed. The value could be a data element and the first accumulation operation speed could be a data element accumulation operation speed. Continuing with this example, the first accumulation operation speed could be at least as fast as the output speed of 256 data elements per nanosecond. The second accumulator 112 could accumulate a value from the first memory 113 in the second memory 114 at a second accumulation operation speed. The value could be a data element and the speed of the second accumulation operation speed could be a data element accumulation operation speed. In keeping with the above example, the second accumulation operation speed could be slower than the first accumulation operation speed of 256 data elements per nanosecond allowing a relatively slower memory to be used because the second accumulator does not need to accumulate values every nanosecond.

The speed differential between different levels of the hierarchy could be caused by various factors. For example, the logic circuits of the accumulator of a level of the hierarchy could be slower at conducting the summing operations required for that level of the hierarchy than the accumulator of the prior level. In the alternative or in combination, each level of the hierarchical accumulator could utilize memory that has a slower read and/or write speed than the prior level. As there is, generally, an inverse relationship between the speed and size/cost of different types of memory, this configuration allows each layer of the hierarchy to be slower but larger/cheaper than the prior level. Applying this configuration to FIG. 1, the first memory 113 would be faster and smaller than second memory 114. For example, first memory 113 could be a small 4,096 bit register memory and second memory 114 could be a larger 131,072 bit static random-access memory.

Figure 2:
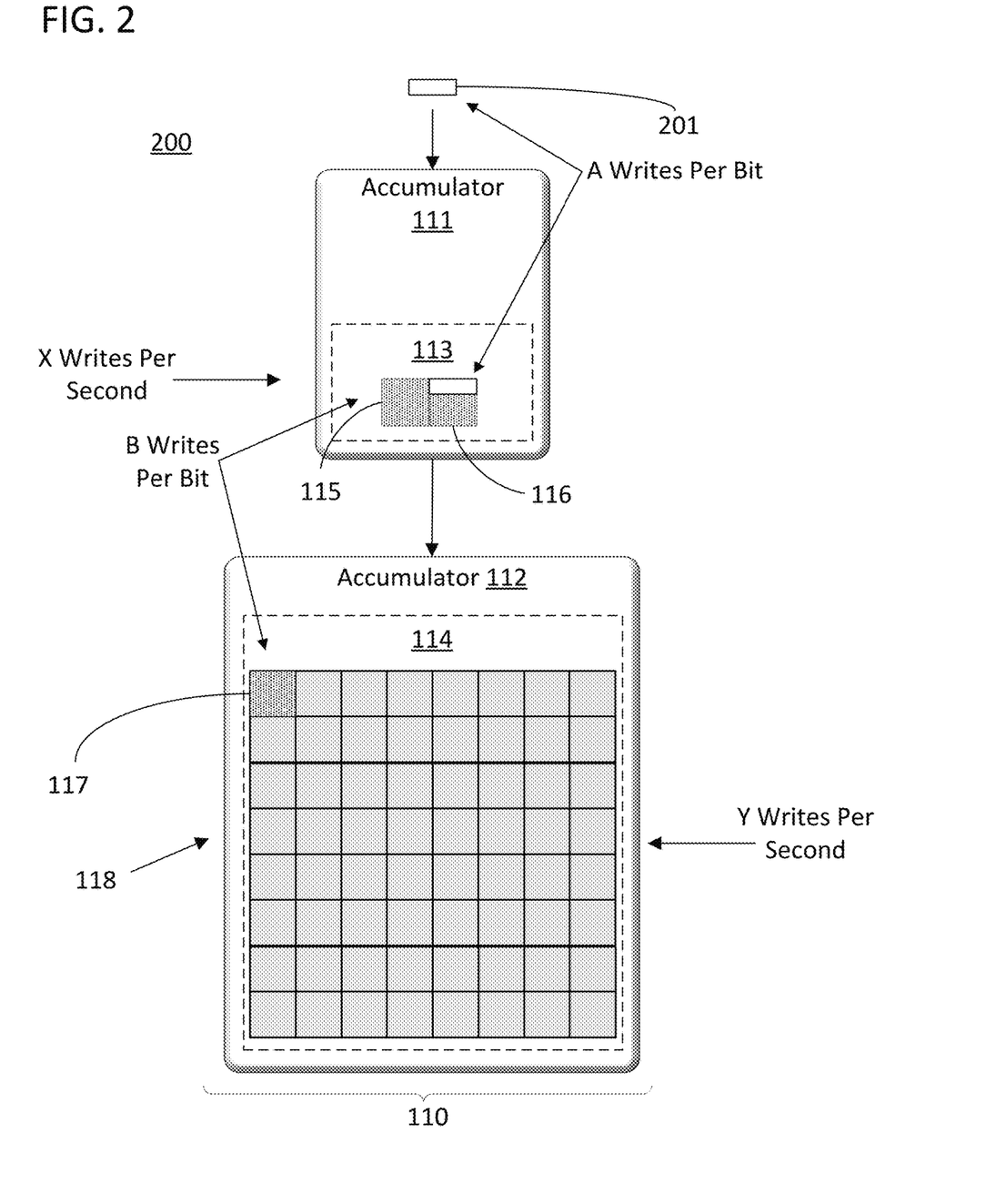
FIG. 2 illustrates a block diagram of the hierarchical accumulator of FIG. 1 annotated to illustrate the interoperation of the levels of the hierarchical accumulator in accordance with specific embodiments of the invention disclosed herein.

FIG. 2 illustrates a block diagram 200 of the hierarchical accumulator 110 of FIG. 1 annotated to illustrate the interoperation of the levels of the hierarchical accumulator in accordance with specific embodiments of the invention disclosed herein. As illustrated, accumulator 111 includes a memory which is broken into memory sector 115 and memory sector 116. Accumulator 111 receives upstream outputs 201 (which could be the outputs of math circuit 101) and accumulates them in memory 113. As illustrated, the outputs generated by the math circuit, such as output 201, can have an output size and the sectors of the first memory, such as memory sector 115 and memory sector 116, can be at least as large as the output size. Accordingly, each sector of memory can hold the entire output of the math circuit for a given input. In specific embodiments of the invention, such as the one illustrated in FIG. 2, the first memory includes a first sector and a second sector which are both equal in size to the output size.

In specific embodiments of the invention, the memory of each level of the hierarchy is broken into at least two sectors which are in either an idle or active state with respect to one level while being in the alternative state with respect to an adjacent level. For example, in a hierarchical accumulator having two levels with the first level having a first accumulator with a first memory, and a second level having a second accumulator with a second memory, the first memory could be broken into a first sector and a second sector having this characteristic. The active state would be associated with an accumulator accumulating from/to that sector and the idle state would be associated with an accumulator not accumulating from/to that sector. In keeping with this example, the first accumulator could accumulate in the first sector of the first memory when the second accumulator accumulates from the second sector of the first memory, and the first accumulator could accumulate in the second sector of the first memory when the second accumulator accumulates from the first sector of the first memory.

As illustrated in FIG. 2, hierarchical accumulator 110 could have accumulator 111 switch between utilizing memory sector 116 and memory sector 115 as additional upstream outputs, such as upstream output 201, were received. The sector in which accumulator 111 was currently accumulating values, such as memory sector 116 in FIG. 2, could be referred to as the active sector while any sector in which accumulator 111 was currently not accumulating values, such as memory sector 115 in FIG. 2, could be referred to as an idle sector. The sector that is currently active could change with each upstream output received by the level of the hierarchy, or it could change less frequently. In the example of FIG. 1, assuming that the inputs are matrices of equal sizes being multiplied, the sector that is active would change each time a new set of inputs was provided to the source registers.

In specific embodiments of the invention, a lower level of an accumulator is configured to read from an idle sector of a higher level of the accumulator while the higher level is engaged in accumulating an output value in an active sector of the higher level quickly enough that all the values are accumulated from the idle sector by the lower level before the sector becomes active again with respect to the higher level. For example, as illustrated, accumulator 112 can read and accumulate all the values from memory sector 115 of memory 113 into memory sector 117 of accumulator 112 before accumulator 111 beings writing in memory sector 115. While accumulator 111 only has two memory sectors, more sectors could be utilized in the same manner with idle sectors being read and accumulated by accumulator 112 before being required to accumulate additional upstream outputs. Each level of the hierarchy could match this characteristic.

In specific embodiments of the invention, the various levels of a hierarchical accumulator are configured so that each level accumulates at a speed in bits per second which is at least as fast as the prior level regardless of whether lower levels of the accumulator have slower accumulation operation speeds than higher levels. As stated previously, each accumulator could have an accumulation operation speed which is slower than the prior level. However, the overall operation of the hierarchical accumulator can be such that while each level has a slower accumulation operation speed than the next higher level, each level can be as fast or faster than the next higher level in terms of bits per second accumulated. For example, a first accumulator could conduct a number of accumulation operations to store an output data value in the first memory in response to a set of operands being applied to the math circuit, and a second accumulator could conduct a number of accumulation operations to store the output data value in the second memory in response to the set of operands being applied to the match circuit, and the number of accumulation operations conducted by the first accumulator could be larger than the number of accumulation operations conducted by the second accumulator. For example, to store a single bit of an output in first memory 113, it could take the provisioning of a set of operands 130 to math circuit 101. This would require eight operations by math circuit 101 with eight different sets of operand inputs. For each set of operand inputs, accumulator 111 would need to conduct at least one accumulate operation. However, to store that single bit of the output in memory 114 could require only a single accumulation. Therefore, so long as the accumulation operation speed of accumulator 111 is less than eight times as fast as accumulator 112, accumulator 112 will be able to keep its required pace in the pipeline.

In FIG. 2 the speed of accumulator 111 is set by the accumulation operation speed of accumulator 111 "X" expressed in writes per second divided by the number of accumulate operations required to compute a bit "A" expressed in writes per bit (i.e., bits per second accumulated=X/A). Continuing with this example, the speed of accumulator 112 is set by the speed of the accumulate operations of accumulator 112 (Y) expressed in writes per second divided by the number of accumulate operations required to compute a bit "B" expressed in writes per bit (i.e., bits per second accumulated=Y/B). In this example X can be larger than Y while the ratio Y/B can be larger than or equal to X/A. While the hierarchical accumulator of FIG. 2 provides a two-level hierarchy, many levels of hierarchy can be utilized so long as the ratio of writes per second and writes per bit remain the same for multiple levels.

Referring again to FIG. 2, but with specific numbers for the variables in the prior paragraph, each bit in accumulator 111 could require 16 upstream outputs 201 to be accumulated to compute the bit, while each bit in accumulator 112 could require a single bit from memory 113 in order to compute the bit. In the case of FIG. 2, memory 113 could be register memory and the value for X could be 1 write per nanosecond. In this example the upstream outputs could be in the form of 16 8-bit integers and all entries could be written in a single cycle of a 1 GHz clock. Continuing with this example, the computational circuit could require 16 upstream outputs 201 to accumulate 1 portion of memory sector 116 where the portion of memory sector 116 had the same size as a single upstream output. As a result, the first level of the hierarchy would accumulate at a speed of 1 write/ns divided by 16 writes/value providing a speed of $\frac{1}{16}$ values per ns. The second level accumulator could have a faster accumulation speed even if memory 114 were a slower memory such as static random-access memory such that the accumulator needed 16 nanoseconds to accumulate. If the computational circuit only required 1 value from memory 113, the second level of the hierarchy would accumulate at a speed of $\frac{1}{16}$ writes per nanosecond divided by 1 writes/value providing a speed of $\frac{1}{16}$ values per ns. Accordingly, the two levels of the accumulator will keep pace with the pipeline providing upstream outputs and the capacity of both levels will be maximally utilized. In specific embodiments of the invention, instead of differences in memory speed, the accumulator operation speed in bits/second of different levels could also differ based on the number of logic circuits at each level where the logic circuits operate on a block of data in step wise fashion across a set of clock cycles (e.g., 16 logic circuits accumulating 32 values across two clock cycles).

Figure 3:
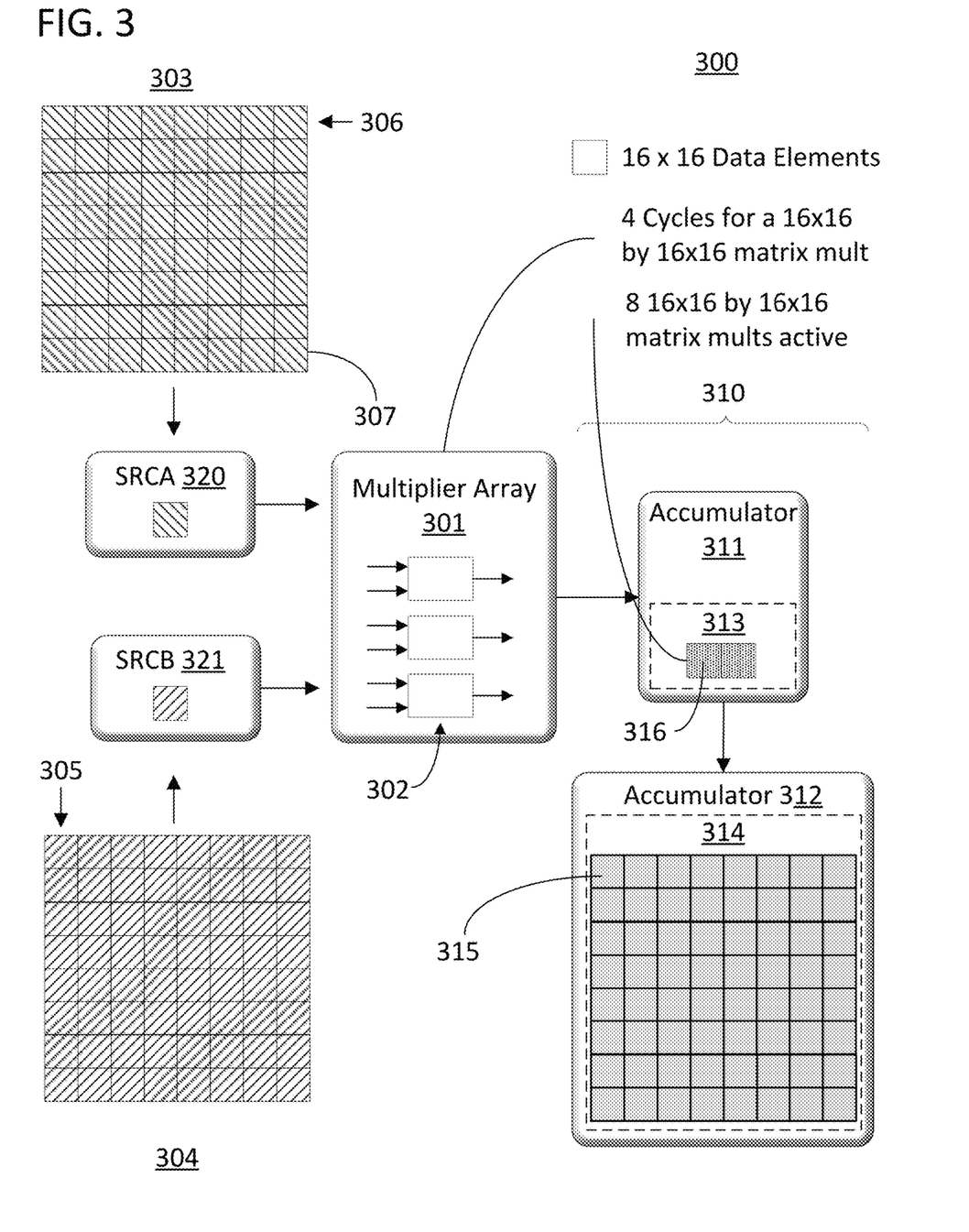
FIG. 3 illustrates a block diagram of a matrix multiplication circuit with a hierarchical accumulator in accordance with specific embodiments of the invention disclosed herein.

FIG. 3 illustrates a block diagram of a matrix multiplication circuit 300 with a hierarchical accumulator 310 in accordance with specific embodiments of the invention disclosed herein. Hierarchical accumulator 310 includes a first accumulator 311 which can exhibit the features of first accumulator 111 described above. Hierarchical accumulator 310 also includes a second accumulator 312 which can exhibit the features of second accumulator 112 described above. First accumulator 311 includes a register memory 313. Second accumulator 312 includes a static random-access memory 314. Matrix multiplication circuit 300 is designed to multiply a first input matrix 303 with a second input matrix 304 to produce an output matrix. The output matrix can be stored in static random-access memory 314. Matrix multiplier array 301 which includes an array of discrete multiplication computation units 302 which accept two operands, multiply them together, and output the product. The overall matrix multiplication of first input matrix 303 and second input matrix 304 can involve multiplier array 301 conducting all the product operations and first accumulator 311 and second accumulator 312 conducting all of the sum operations for the component product-sum calculations required for a matrix multiplication.

In specific embodiments of the invention in accordance with FIG. 3, the output matrix of the matrix multiplication circuit will comprise portions that correspond uniquely with sectors of a memory of the hierarchical accumulator. For example, the sectors of static random-access memory 314 are in a one-to-one correspondence with the portions of an output matrix that would result from the multiplication of first input matrix 303 and second input matrix 304. The matrices of FIG. 3 are drawn as divided into individual portions such as portion 307. These individual portions are applied to source A register 320 and source register B 321 in a pipelined fashion to conduct the matrix multiplication. The individual portions of the matrices could be scalar data elements of a data type compatible with matrix multiplier array 301 (e.g., 8-bit integer, 16-bit floating point, etc.). The portions could also be vectors or multidimensional tensors with a set of data elements of the same or various data types (e.g., each input could be a 16×16 tensor of individual data elements each of a 16-bit floating point data type). Accordingly, the multiplier array 301 may include an array of discrete multiplication computation units 302 (e.g., computational circuits) to conduct operations on the various data elements of the inputs to the math circuit in parallel.

In the example of FIG. 3, each portion of the input matrices is a 16×16 array of data elements. The sectors of static random-access memory 314 and register memory 313 (e.g., sector 315) are therefore memories that can store 16×16 data elements. The multiplier array 301 can conduct a matrix multiplication of two input data values, in the form of two 16×16 arrays of data elements, in 4 clock cycles, with new values being output every clock cycle. Accordingly, accumulator 311 will need to have an accumulation operation time as fast as a single clock cycle. However, many writes will be required to compute an output portion of the output matrix in a memory sector of register memory 313 (e.g, sector 316). This is because every 16×16 matrix in column 305 of input matrix 304 must be matrix multiplied with every 16×16 matrix in row 306 of input matrix 303 to compute the portion of the output matrix that corresponds with sector 315 of static random-access memory 314. The first accumulator 311 will accumulate these values, from all eight matrix multiplications done by matrix multiplier array 301 in register memory 313. Accordingly, sector 316 (e.g., a memory sector) will need to remain active for accumulator 311 to accumulate values for 8×4 clock cycles (8 matrix multiplications times 4 clock cycles per matrix multiplication). This allows second accumulator 312 32 clock cycles to accumulate values from the register memory 313 in sector 316 to the static random-access memory 314 in sector 315. Accumulator 312 can therefore have an accumulation operation speed of 32 clock cycles per 16×16 data elements in order to keep pace with the higher level of the accumulator. If a clock cycle is 1 ns, this 32 ns provides sufficient time to read from and write to a static random-access memory.

If matrix multiplication circuit 300 were designed only for matrix inputs with the size of first input matrix 303 and second input matrix 304, the accumulator 312 could be replaced by a static random-access memory and a circuit that could read from register memory 313 and write to static random-access memory 314 alone (i.e., it would not need summing circuits). However, matrix multiplication circuit 300 can be used to conduct large matrix multiplication operations in which the 128×128 matrices shown in FIG. 3 are simply blocks of larger matrices. In specific embodiments, these larger matrices will have inner dimensions equal to the size of a memory of the hierarchical accumulator. In the example of FIG. 3, this would be a matrix of 128×128 data elements so that the correspondence between portions of the output matrix and sectors of static random-access memory 314 can be preserved (i.e., static random-access memory 314 is large enough to store the entire output matrix). In these embodiments, the various blocks could be provided to matrix multiplication circuit 300 in the same way that individual portions of the illustrated matrices are provided to the source registers in a super cycle fashion. The accumulations that occur in accumulator 312 would therefore be used to compute the final values of the output matrix with a sector such as sector 315 being accumulated once per super cycle. In these embodiments, hierarchical accumulator could have another layer that was slower than accumulator 312 (e.g., the memory could be a dynamic random-access memory or EEPROM) while the size of static random-access memory 314 could be reduced in proportion to the speed allowed for writing to the next layer.

In specific embodiments of the invention, the blocks of a matrix are routed from main memory to a processing pipeline of a processor as a unit. In specific embodiments of the invention, the computational circuits disclosed herein are in a pipeline of a processor in a network of processing cores and the blocks are routed through the network as a unit. The blocks could be routed by a controller. The controller could also orchestrate the pipeline on the computational circuit. For example, if the computational circuit were a matrix multiplier circuit, the controller could be programmed to multiply a first matrix and a second matrix using the matrix multiplier circuit to generate an output matrix, provide the first matrix to the multiplier array in a first series of blocks, and provide the second matrix to the matrix multiplier circuit in a second series of blocks. In these embodiments, the second memory of the hierarchical accumulator, such as register memory 313 could be as large as the output matrix.

Regardless of which type of embodiment is involved, routing large blocks of data through a processor or network of processing cores takes up valuable hardware and power resources. Accordingly, conducting matrix multiplications in a manner which maximizes data reuse and the time between when additional blocks of data are required from the slowest link in the pipeline can create significant benefits. Accordingly, the controller can be programmed to only retrieve blocks from the slowest link once (i.e., retrieve the block from the slowest link and conduct all the computations that block is involved in before retrieving another). In a matrix multiplication this will require alternative blocks (i.e., blocks taken from faster links) to be retrieved from memory multiple times.

Figure 4:
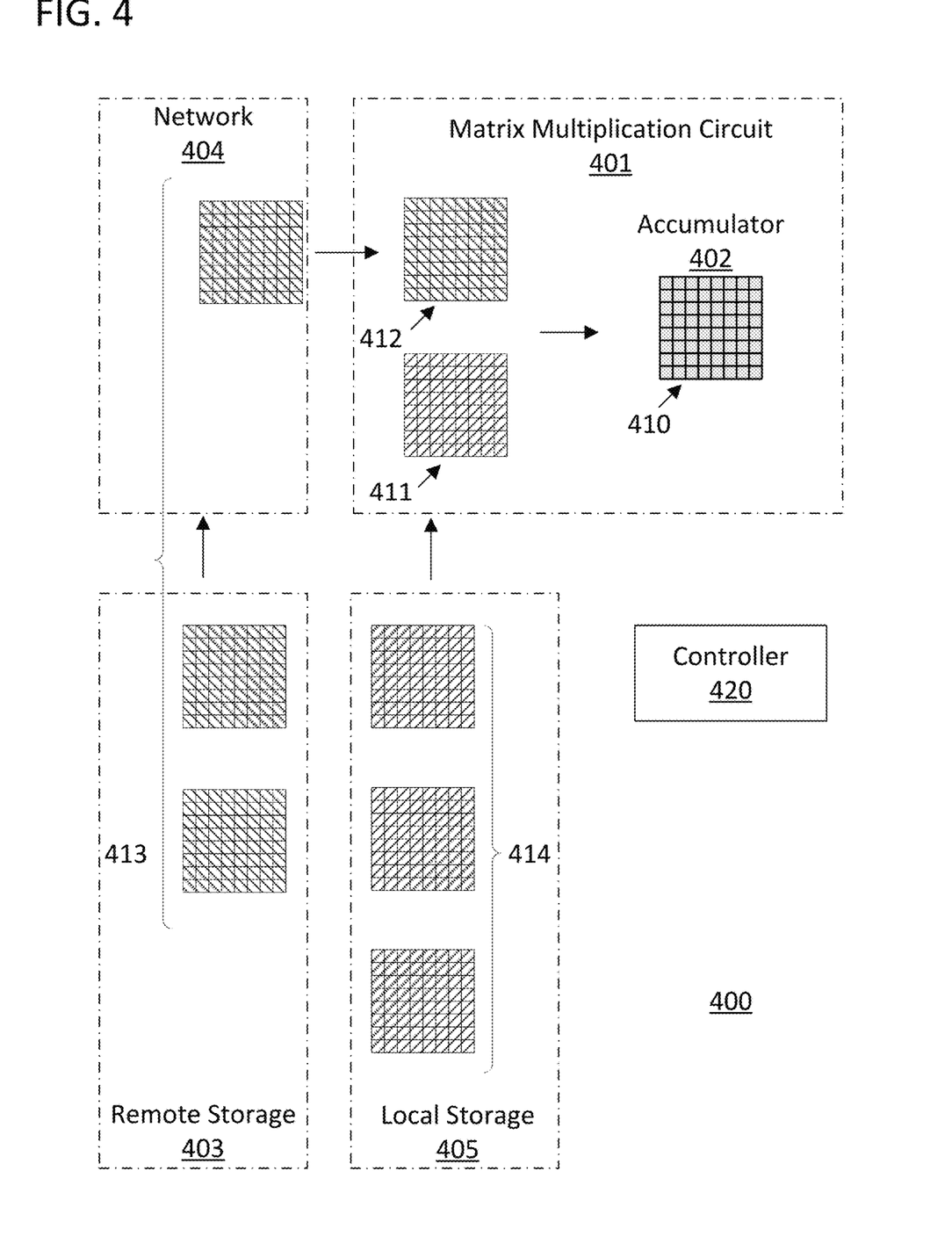
FIG. 4 illustrates a block diagram of a system with a matrix multiplication circuit having an accumulator where the matrix multiplication circuit receives one set of data values from a remote storage via a network, and another set of data values from a local storage in accordance with specific embodiments of the invention disclosed herein.

FIG. 4 is a block diagram of a system 400 with a matrix multiplication circuit 401 having an accumulator 402 where the matrix multiplication circuit 401 receives one set of data values from a remote storage 403 via a network 404, and another set of data values from a local storage 405. The data values from remote storage 403 can be blocks of a first matrix. The data values from local storage 405 could be blocks of a second matrix. The inner dimensions of the first and second matrixes will set the dimensions of the output matrix 410. The local storage 405 could be the main memory of a processor. The remote storage 403 could be the main memory of another processor where network 404 connects the two processors such that they can operate as multiple cores in a multicore processor. The accumulator could be a hierarchical accumulator such as second accumulator 312. The accumulator includes a memory storing an output matrix 410. The matrix multiplication circuit 401 operates on a first input matrix block 412 retrieved via network 404 from a set of first input matrix blocks 413, and a second input matrix block 411 retrieved from local storage 405 from a set of second input matrix blocks 414. The super cycle mentioned with reference to FIG. 3 is conducted each time a new block is retrieved from either remote storage 403 or local storage 405. The super cycle could be orchestrated by a controller 420 which is programmed to multiply a first matrix (e.g., made of the set of first input matrix blocks 413) and a second matrix (e.g., made of the set of second input matrix blocks 414) using matrix multiplication circuit 401, provide the first matrix to the matrix multiplication circuit 401 in a first series of blocks (e.g., a series formed by set of first input matrix blocks 413), and provide the second matrix to the matrix multiplication circuit 401 in a second series of blocks (e.g., a series formed by set of second input matrix blocks 414).

In specific embodiments of the invention, the hierarchical accumulator, and block sizes used by system 400 can be selected to minimize pressure placed on the network 404. In FIG. 4, the system can be designed to cycle through all the values from local storage 405 while conducting super cycles with a single input matrix block from set of first input matrix blocks 413. Accordingly, in the illustrated case, and assuming the super cycles have the characteristics of the specific example provided with reference to FIG. 3 and each matrix is divided into four blocks, the network will have at least 32×16×16×4 clock cycles in which to deliver another block. The size of accumulator 402 therefore has a direct impact on decreasing the pressure placed on the network. If the accumulator were simply a single fast accumulator (e.g., required to have an accumulation operation speed of 1 clock cycle), the accumulator would be prohibitively expensive. Therefore, using the hierarchical accumulators disclosed herein provide significant benefits in these types of applications because the output matrix can be accumulated in a slightly cheaper memory that can be made large enough to support large block sizes. This benefit applies even more acutely if both input matrixes comprise blocks that are delivered from remote storage.

Figure 5:
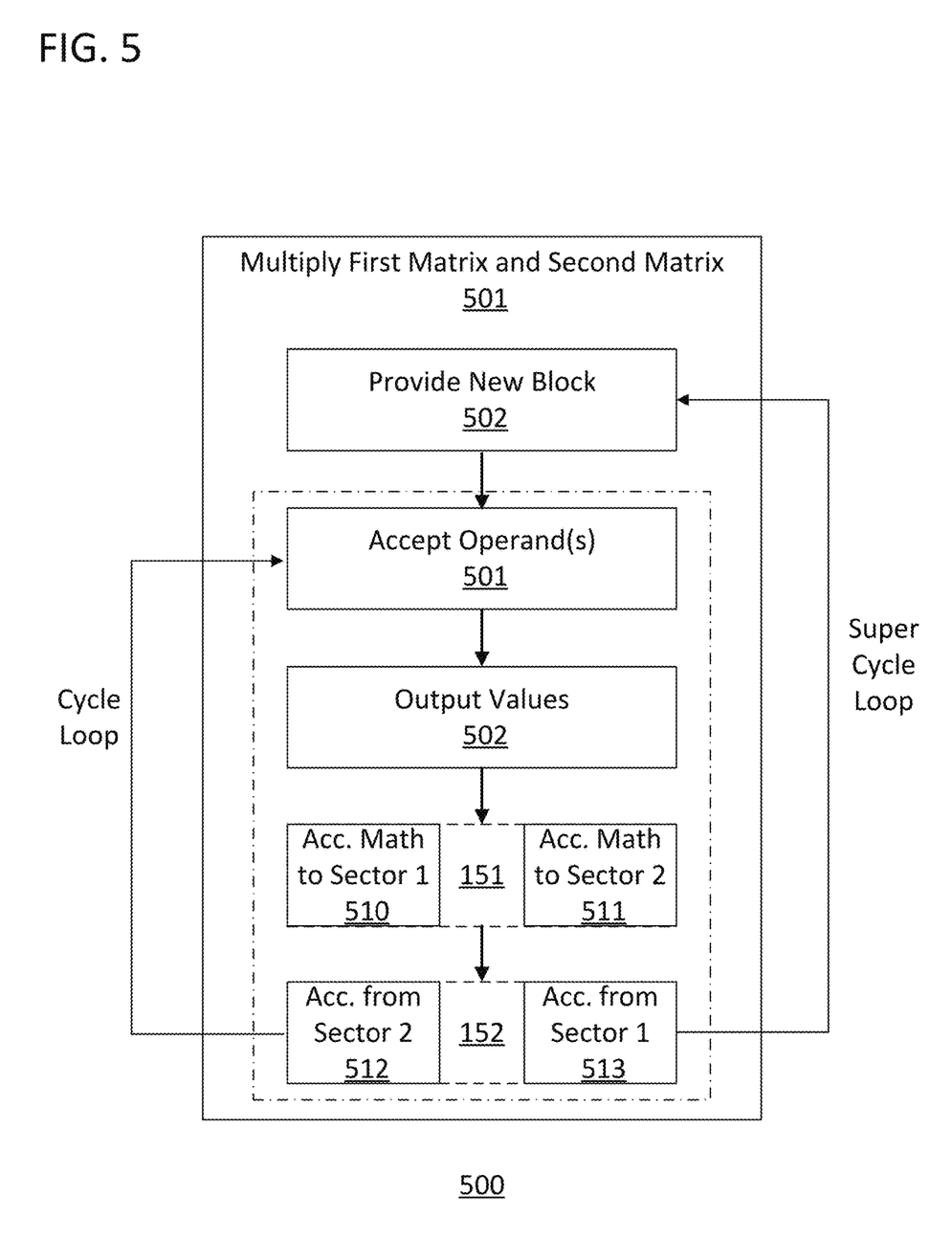
FIG. 5 illustrates a flow chart for a set of methods for operating a hierarchical accumulator in accordance with specific embodiments of the invention disclosed herein.

FIG. 5 illustrates a flow chart 500 for a set of methods for operating a hierarchical accumulator in accordance with specific embodiments of the invention disclosed herein. Flow chart 500 includes steps 151 and 152 from FIG. 1 nested within a step 501 of multiplying a first matrix and a second matrix to produce an output matrix. Flow chart 500 further includes a step 502 of providing the first matrix and the second matrix to a computational circuit as a set of blocks. The step is shown as part of a super cycle loop as the remaining steps can be conducted multiple times before another block is required. The blocks could be blocks such as blocks 412 and 411 from FIG. 4. Flow chart 500 further includes a step 501 of accepting, using a computational circuit, the set of blocks as operands. The step is shown as part of a cycle loop because the remaining steps can be conducted multiple times as different portions of the blocks are fed to the computational circuit. The computational circuit could be computational circuit 100 from FIG. 1 or matrix multiplication circuit 300 from FIG. 3. The computational circuit could include a math circuit such as math circuit 101. The second memory 114 could be at least as large as the output matrix. The math circuit could be a multiplier array such as multiplier array 301. As such, the portions of the blocks that are provided to the computational circuit as operands could be the subblocks from a set of operand inputs, such as set 130. The values from the math circuit which are utilized in step 151 could be generated using the set of blocks as operands and could comprise a set of products the first memory used in step 151 could be at least twice as large as the set of products. The related step is shown as step 502 of outputting values for the first accumulator using the math circuit. Step 502 could involve generating a set of products required to compute the output matrix.

In accordance with the approaches disclosed above, and the example of flow chart 500 step 151 and step 152 could include sub-steps in which different layers of the hierarchical accumulator utilize different sectors of the first memory and second memory. As illustrated, step 151 includes a sub-step 510 of accumulating, using the first accumulator with the first memory, values from the math circuit in a first sector of the first memory and a simultaneously conducted step 511 of accumulating using the second accumulator with the second memory, values from a second sector of the first memory in the second memory. As further illustrated, step 152 includes a sub-step 512 of accumulating, using the first accumulator with the first memory, values from the math circuit in the second sector of the first memory and a simultaneously conducted step 513 of accumulating, using the second accumulator with the second memory, values from the first sector of the first memory in the second memory.

The relative memory sizes and speeds at which steps are conducted in the implementations of flow chart 500 can match those described with reference to FIGS. 1-4. For example, in specific embodiments of the invention, the first sector of the first memory will be at least as large as the output size of the outputs generated by the math circuit in each cycle of step 502. As another example, in specific embodiments of the invention, the first sector of the first memory used in sub-step 510 is equal in size to the output size of the outputs generated in step 502, and the second sector of the first memory used in step 511 is likewise equal in size to the output size of the outputs generated in step 502. As another example, in specific embodiments of the invention, the step 502 of outputting values for the first accumulator using the math circuit is done at an output speed, step 151 is done at a first per value accumulation speed which is at least as fast as the output speed, and step 152 is done at a second per value accumulation speed which is slower than the first per value accumulation speed.

The hierarchical accumulators disclosed herein can be part of the processing pipeline of a processor. The processors can include one or more hierarchical accumulators. The processors can take on various forms. The processors can be processing cores in a multicore processor or standalone processors. The processors can be implemented as single chip systems, including wafer-scale single chip systems, multichip single package systems, or in a multichip multi-package system in which the chips are commonly attached to a common substrate such as a printed circuit board (PCB), interposer, or silicon mesh. The processor can be part of a network of processors. The network can be a network on chip (NoC). The processors in accordance with this disclosure can also be part of a network that includes chips on multiple substrates linked together by a higher-level common substrate such as in the case of multiple PCBs each with a set of chips where the multiple PCBs are fixed to a common backplane. Processors in accordance with this disclosure can also be implemented in chiplet based systems. For example, in specific embodiments of the invention, one or more processors could be housed or implemented by one or more networked chiplets, connected, for example, through an interposer.

A processor in accordance with this disclosure can included at least one non-transitory computer readable media. The at least one processor could comprise at least one computational node in a network of computational nodes. The media could include cache memories on the processor. The media can also include shared memories that are not associated with a unique computational node. The media could be a shared memory, could be a shared random-access memory, and could be, for example, a DDR DRAM. The shared memory can be accessed by multiple channels. The non-transitory computer readable media can store data required for the execution of any of the methods disclosed herein, the instruction data disclosed herein, and/or the operand data disclosed herein. The computer readable media can also store instructions which, when executed by the system, cause the system to execute the methods disclosed herein. The concept of executing instructions is used herein to describe the operation of a device conducting any logic or data movement operation, even if the "instructions" are specified entirely in hardware (e.g., an AND gate executes an "and" instruction). The term is not meant to impute the ability to be programmable to a device.

A processor in accordance with this disclosure can include at least one logic circuit as described above. The logic circuit can include both active and passive devices and operate with one or more logic levels. The logic circuit can operate using Boolean logic and can be a synchronous clocked circuit or an asynchronous circuit. The logic circuit can include logic gates, flip-flops, latches, registers, and other fundamental circuit components that are required to produce a digitized logical output in response to a digitized logical input. The logic circuit can be implemented directly in hardware such that a logic or operation is conducted by a physical collection of transistors that implement an OR gate and the storage of a data element involves the physical state of at least one flip flop, delay line, or other physical storage element.

While the specification has been described in detail with respect to specific embodiments of the invention, it will be appreciated that those skilled in the art, upon attaining an understanding of the foregoing, may readily conceive of alterations to, variations of, and equivalents to these embodiments. Any of the method disclosed herein can be executed by a processor in combination with a computer readable media storing instructions for the methods in combination with the other hardware elements described above. These and other modifications and variations to the present invention may be practiced by those skilled in the art, without departing from the scope of the present invention, which is more particularly set forth in the appended claims.

What is claimed is:

1. A computational circuit comprising:
   a math circuit;
   a first accumulator communicatively connected to the math circuit, having a first memory, and that accumulates values from the math circuit in the first memory;
   a second accumulator communicatively connected to the first memory, having a second memory, and that accumulates values from the first memory in the second memory; and
   wherein the first memory is faster and smaller than the second memory.

2. The computational circuit of claim 1, further comprising:
   a first sector of the first memory;
   a second sector of the first memory; and
   wherein: (i) the first accumulator accumulates in the first sector of the first memory when the second accumulator accumulates from the second sector of the first memory; and (ii) the first accumulator accumulates in the second sector of the first memory when the second accumulator accumulates from the first sector of the first memory.

3. The computational circuit of claim 2, wherein:
   the math circuit generates an output with an output size; and
   the first sector of the first memory is at least as large as the output size.

4. The computational circuit of claim 3, wherein:
   the first sector of the first memory is equal in size to the output size; and
   the second sector of the first memory is equal in size to the output size.

5. The computational circuit of claim 1, wherein:
   the math circuit outputs values at an output speed;
   the first accumulator accumulates a value from the math circuit in the first memory at a first accumulation operation speed;
   the first accumulation operation speed is at least as fast as the output speed;
   the second accumulator accumulates a value from the first memory in the second memory at a second accumulation operation speed; and
   the second accumulation operation speed is slower than the first accumulation operation speed.

6. The computational circuit of claim 5, wherein:
   the first accumulator conducts a number of accumulation operations to store an output data value in the first memory in response to a set of operands being applied to the math circuit;
   the second accumulator conducts a number of accumulation operation to store the output data value in the second memory in response to the set of operands being applied to the math circuit; and the number of accumulation operations to store the output data value in the first memory is greater than the number of accumulation operation to store the output data value in the second memory.

7. The computational circuit of claim 1, wherein:
the math circuit is a multiplier array;
the math circuit generates a set of products required to compute an output matrix; and
the first memory is at least as large as the output matrix.

8. A system using the computational circuit of claim 1, further comprising:
a controller;
wherein the computational circuit is a matrix multiplier circuit;
wherein the controller is programmed to: (i) multiply a first matrix and a second matrix using the matrix multiplier circuit to generate an output matrix; (ii) provide the first matrix to the matrix multiplier circuit in a first series of blocks; and (iii) provide the second matrix to the matrix multiplier circuit in a second series of blocks; and
wherein the second memory is at least as large as the output matrix.

9. The system of claim 8, further comprising:
a network;
a remote memory that is accessible via the network;
a local memory located on a substrate with the computational circuit;
wherein the first series of blocks are provided from the local memory; and
wherein the second series of blocks are provided from the remote memory.

10. The computational circuit of claim 1, wherein:
the first memory is a register memory; and
the second memory is a static random-access memory.

11. A method comprising:
accumulating, using a first accumulator with a first memory, values from a math circuit in the first memory;
accumulating, using a second accumulator with a second memory, values from the first memory in the second memory; and
wherein the first memory is faster and smaller than the second memory.

12. The method of claim 11, further comprising:
accumulating, using the first accumulator with the first memory, values from the math circuit in a first sector of the first memory while accumulating, using the second accumulator with the second memory, values from a second sector of the first memory in the second memory; and
accumulating, using the first accumulator with the first memory, values from the math circuit in the second sector of the first memory while accumulating, using the second accumulator with the second memory, values from the first sector of the first memory in the second memory.

13. The method of claim 12, further comprising:
generating, using the math circuit, an output with an output size; and
wherein the first sector of the first memory is at least as large as the output size.

14. The method of claim 13, wherein:
the first sector of the first memory is equal in size to the output size; and
the second sector of the first memory is equal in size to the output size.

15. The method of claim 12, further comprising:
outputting values for the first accumulator using the math circuit and at an output speed;
wherein the accumulating, using the first accumulator, is done at a first per value accumulation speed which is at least as fast as the output speed; and
wherein the accumulating, using the second accumulator, is at a second per value accumulation speed which is slower than first per value accumulation speed.

16. The method of claim 15, wherein:
the first accumulator conducts a number of accumulation operations to store an output data value in the first memory in response to a set of operands being applied to the math circuit;
the second accumulator conducts a number of accumulation operation to store the output data value in the second memory in response to the set of operands being applied to the math circuit; and
the number of accumulation operations to store the output data value in the first memory is greater than the number of accumulation operation to store the output data value in the second memory.

17. The method of claim 11, wherein:
the math circuit is a multiplier array;
the math circuit generates a set of products required to compute an output; and
the first memory is at least twice as large as the set of products.

18. The method of claim 11, further comprising:
multiplying a first matrix and a second matrix to produce an output matrix;
providing the first matrix and the second matrix to a computational circuit including the math circuit as a set of blocks;
accepting, using the computational circuit, the set of blocks as operands;
wherein the values from the math circuit are generated using the set of blocks as operands; and
wherein the second memory is at least as large as the output matrix.

19. The method of claim 11, wherein:
the first memory is a register memory; and
the second memory is a static random-access memory.

* * * * *